United States Patent [19]

Dogadko et al.

[11] 4,251,848
[45] Feb. 17, 1981

[54] ELECTRONIC ACCELERATOR PUMP TIMING CONTROL

[75] Inventors: Peter Dogadko, Chicago; Richard F. Jereb, Antioch, both of Ill.

[73] Assignee: Outboard Marine Corporation, Waukegan, Ill.

[21] Appl. No.: 5,990

[22] Filed: Jan. 24, 1979

[51] Int. Cl.³ .............................................. H01H 47/18
[52] U.S. Cl. ..................................... 361/196; 361/190; 361/205
[58] Field of Search ............... 361/152, 153, 160, 190, 361/196, 197, 198, 205; 307/293

[56] References Cited

U.S. PATENT DOCUMENTS

| | | | |
|---|---|---|---|
| 3,365,588 | 1/1968 | Tussing | 307/293 X |
| 3,379,896 | 4/1968 | Wolfe | 361/196 X |
| 3,949,278 | 4/1976 | Kinnard et al. | 361/205 X |

*Primary Examiner*—Harry E. Moose, Jr.
*Attorney, Agent, or Firm*—Michael, Best & Friedrich

[57] ABSTRACT

Disclosed herein is an electronic timing circuit which can be incorporated in an accelerator pump timing control, also disclosed herein. The timing circuit is adapted to be connected to the first and second power terminals of a DC supply and for energizing a load, for example, a fuel pump solenoid valve, during a predetermined timed cycle. The circuit includes a thyristor having an anode-cathode path adapted to be connected to the load so that when the thyristor is rendered conductive by a trigger pulse applied to the gate, current flows from the DC supply through the thyristor to energize the load and start the timed cycle. A transistor control circuit including a transistor connected in series relation with the anode-cathode path is operable for controlling the energizing current flow through the thyristor, subject to a relaxation oscillator included in the timing circuit. The relaxation oscillator produces a stop pulse a predetermined time after the start of the timed cycle for rendering the transistor operative to interrupt the energizing current flow through the thyristor and to thereby deenergize the load and end the timed cycle.

14 Claims, 1 Drawing Figure

U.S. Patent  Feb. 17, 1981  4,251,848
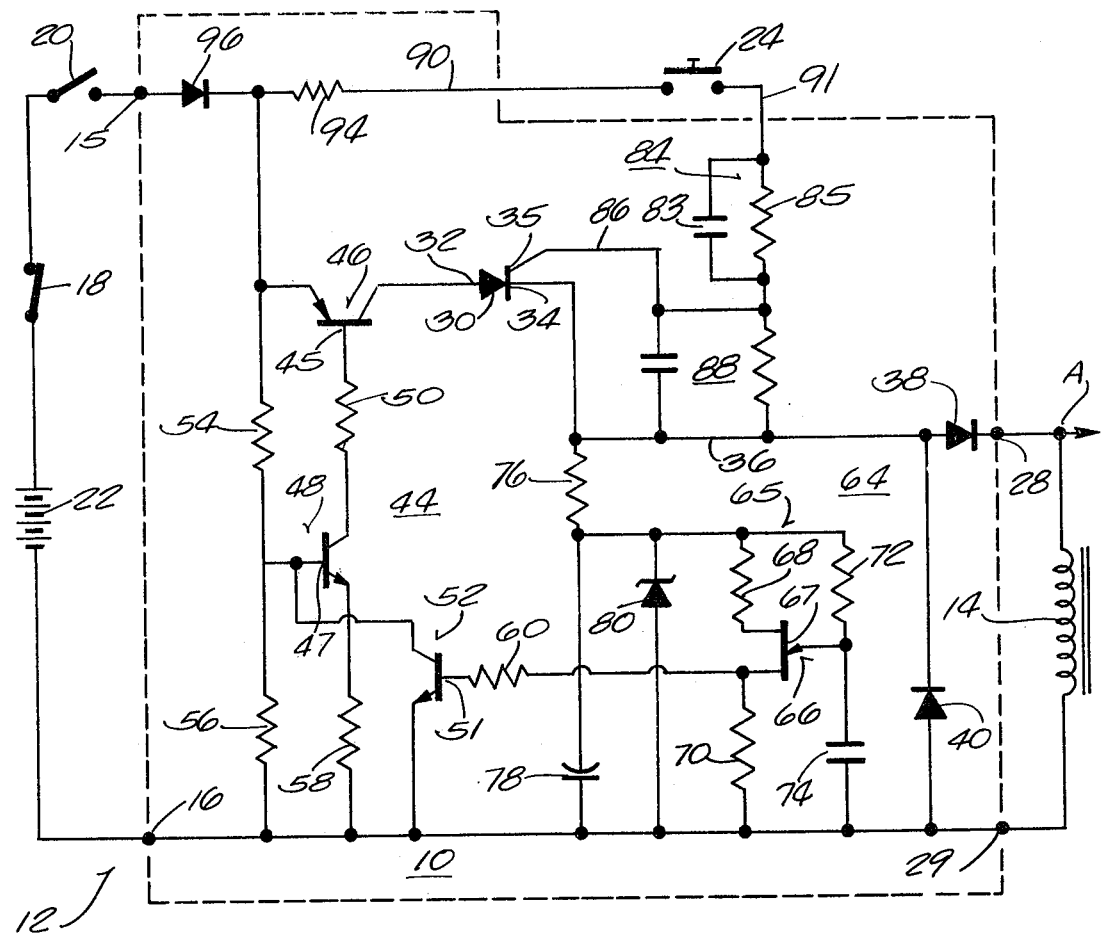

ELECTRONIC ACCELERATOR PUMP TIMING CONTROL

BACKGROUND OF THE INVENTION

The invention relates to electronic timing circuits, and more particularly, to an electronic accelerator pump timing control including a timing circuit for energizing a fuel pump solenoid valve during a predetermined time interval.

Attention is directed to the following U.S. Pat. Nos.: Houpt, 3,622,811, issued Nov. 23, 1971; Felcheck, 3,381,180 issued Apr. 30, 1968; and Culbertson, 3,303,396, issued Feb. 7, 1967.

SUMMARY OF THE INVENTION

The invention provides an electronic timing circuit adapted to be connected to the first and second power terminals of a DC supply and for energizing a load during a predetermined timed cycle. The circuit comprises first semiconductor switching means having first, second, and third terminals, and a first-second terminal path adapted to be connected to the load to be energized. The first switching means is rendered conductive between the first and second terminals upon application of a trigger pulse to the third terminal so that current flows from the DC supply through the first switching means to energize the load and start the timed cycle. The circuit also includes control circuit means including second semiconductor switching means connected in series relation with the first-second terminal path and operable for controlling the energizing current flow through the first switching means, and timing circuit means connected in circuit with the first switching means and the control circuit means and operable a predetermined time after the start of the timed cycle for rendering the control circuit means operative to interrupt the energizing current flow through the first switching means to thereby deenergize the load and end the timed cycle.

In accordance with an embodiment of the invention, the timing circuit means comprises relaxation oscillator means operable the predetermined time after the start of the time cycle for generating a stop pulse which is coupled to the circuit control means for rendering the circuit control means operative to deenergize the load and end the timed cycle. The relaxation oscillator means preferably comprises a unijunction transistor having a first-base emitter path connected to the circuit control means and through which the stop pulse flows the predetermined time after the start of the timed cycle. The relaxation oscillator means also preferably comprises a resistor and capacitor connected in series relation and having a junction point therebetween connected to the emitter of the unijunction transistor, and voltage regulator means connected in parallel across the series connected resistor and capacitor.

Also in accordance with an embodiment of the invention, the control circuit means includes third switching means operable for receiving the stop pulse and for controlling conduction of the second switching means so that when the timing circuit means generates the stop pulse, the third switching means renders the second switching means operative to interrupt the energizing current flow to thereby deenergize the load and end the timed cycle. The second switching means preferably comprises a first transistor and the third switching means preferably comprises second and third transistors. The third transistor is rendered conductive upon generation of the stop pulse to thereby render the second and first transistors nonconductive so that the first transistor interrupts the energizing current flow through the first switching means.

Also in accordance with an embodiment of the invention, the timing circuit further comprises a switch moveable from a first to a second position to initiate the timed cycle, and trigger pulse forming means connected to the switch for applying a trigger pulse to the gate when the switch is moved to the second position. The trigger pulse forming means preferably comprises a first parallel RC network having one end connected to the third terminal of the first switching means and having an opposite end which is connected to one of the power terminals when the switch moves to the second position. The timing circuit also preferably includes a parallel RC network connected between the second and third terminals of the first switching means for preventing false triggering.

The invention also provides an accelerator pump timing control incorporating the electronic timing circuit described above, and which operates to energize a fuel pump solenoid valve during the predetermined timed cycle. The first switching means of the timing circuit preferably comprises a thyristor having an anode-cathode path which, when the thyrister is rendered conductive by a trigger pulse applied to the gate, supplies current to the relaxation oscillator and also to the solenoid valve.

One of the principal features of the invention is the provision of an electronic timing circuit which reliably energizes a load during a predetermined timed cycle.

Another of the principal features of the invention is the provision of an accelator pump timing control which includes such an electronic timing circuit and which energizes a fuel pump solenoid valve in response to an initial trigger pulse, and ignores all signals after the initial trigger pulse until after the completion of the timed cycle.

Other features and advantages of the embodiments of the invention will become known by reference of the following drawing, general description and claims.

DRAWINGS

The sole FIGURE is a schematic view of an accelerator pump timing control incorporating an electronic timing circuit and embodying various features of the invention.

Before explaining the embodiments of the invention in detail, it is to be understood that the invention is not limited in its application to the details of construction and the arrangement of components set forth in the following description or illustrated in the drawings. The invention is capable of other embodiments and of being practiced and carried out in various ways. Also, it is to be understood that the phraseology and terminology employed herein is for the purpose of description and should not be regarded as limiting.

GENERAL DESCRIPTION

Shown in the sole FIGURE is an electronic timing circuit 10 which, as illustrated, can be incorporated, for example, into an accelerator pump timing control, generally designated 12. The circuit 10 includes a pair of terminals 15 and 16 adapted to be connected to a DC power supply 22 by closing, for example, key switch 18 and switch 20, included in the control 12. The control 12 also includes a fuel pump solenoid valve 14 (diagrammatically and partially shown) which is connected across load terminals 28 and 29 of circuit 10, and which, when energized, operates to provide a fuel flow, for example, to a cylinder of an internal combustion engine. As illustrated, the control 12 also includes a switch 24 (diagrammatically shown) which can be manually or automatically operated. As will be described below, when the switch 24 is closed, assuming switches 18 and 20 are closed, the circuit 10 operates to energize the solenoid valve 14 during a predetermined time interval or timed cycle.

More specifically, as shown in the illustrated construction, the timing circuit 10 includes first semiconductor switching means, preferably in the form of a thyristor 30, having an anode 32, a cathode 34 and a gate 35. The anode-cathode path is connected to the load or solenoid valve 14 by line 36, which connects the cathode 34 to the circuit load terminal 28 as shown. A blocking diode 38 is preferably included in line 36, as illustrated, in order to allow the solenoid 14 to be externally energized by an override switch or signal (not shown) connected to the point designated "A" without damaging the timing circuit. A free wheeling diode 40 is also preferably included in the timing circuit 10, and is coupled across solenoid valve 14 as shown.

Upon application of an initial trigger pulse to the gate 35, the thyristor 30 is rendered conductive so that current flows from the DC supply through thyristor 30 to energize the solenoid valve 14 and start the timed cycle, subject to control circuit means, generally designated 44, which is operable for controlling the energizing current flow through the thyristor 30. More particularly, while various control circuit means arrangements could be utilized, the control circuit means 44 preferably includes second semiconductor switching means, preferably in the form of a PNP transistor 46, which has its emitter-collector path connected in series relation with the cathode-anode path of the thyristor 30 to control current flow therethrough.

As illustrated, the control circuit means 44 also preferably includes third semiconductor switching means, preferably in the form of an NPN transistor 48 having its collector-emitter path connected through resistor 50 to the base 45 of transistor 46, and fourth semiconductor switching means, preferably in the form of an NPN transistor 52 having its collector-emitter path connected to the base 47 of transistor 48. As illustrated, the control circuit means also includes resistors, 54, 56, and 58 which bias the transistors 46, 48, and 52, and a current limiting resistor 60 connected to the base 51 of transistor 52. As will be described in more detail below, the control circuit means is operable for controlling the energizing current flow through the thyristor 30, the duration of the energizing current flow being subject to timing circuit means 64, also included in the timing circuit 10.

More particularly, timing circuit means, generally designated 64, is connected in circuit with thyristor 30 and control circuit means 44 and is operable a predetermined time after the start of the timed cycle for generating a stop pulse which renders the control circuit means operative to interrupt the energizing current flow through the thyristor 30, to thereby deenergize the solenoid valve 14 and end the timed cycle. While various timing circuit means arrangements could be utilized, as illustrated, the timing circuit means 64 preferably comprises relaxation oscillator means or a relaxation oscillator, generally designated 65, which includes a unijunction transistor 66, biasing resistors 68 and 70, and a series connected resistor 72 and capacitor 74, the junction point therebetween being connecting to the emitter 67 of the unijunction transistor 66. Current is supplied to the relaxation oscillator 65 through resistor 76 which connects the relaxation oscillator 65 to the cathode 34 of thyristor 30. A power supply or regulated voltage for the oscillator is provided by voltage regulator means, preferably in the form of a capacitor 78 and zener diode 80, each connected in parallel across the series-connected resistor 72 and capacitor 74 as shown.

In order to supply a trigger pulse to the thyristor gate 35, pulse forming means, preferably in the form of a parallel RC network 84, made up of capacitor 83 and resistor 85, is connected at one end to the gate 35 by line 86. As illustrated, the other end of the RC network 84 is selectively connected to the DC supply terminal 14 by switch 24. Specifically, a line 90 connects DC supply terminal 15 to one side of switch 24, and a line 91 connects the other side of switch 24 to the other end of RC network 84. Assuming switches 18 and 20 are closed, when switch 24 closes, the pulse forming RC network 84 is connected to the DC power supply and a trigger pulse is transmitted by line 86 to the gate 35. As illustrated, a current limiting resistor 94 and a diode 96 are preferably included in line 90 between the DC supply terminal 15 and the switch 24. Also as illustrated, the timing circuit 10 preferably includes another parallel RC network, generally designated 88, which is connected at one end to the first RC network 84 and also which is connected at opposite ends to and between the thyristor gate 35 and the thyristor cathode 34 to suppress signals that could turn off or cause false triggering of the thyristor 30. A description of operation of the timing circuit 10 follows below.

OPERATION

The timing circuit 10 is put into a standby mode by closing switches 18 and 20. This allows transistor 48 of the control circuit means 44 to turn on and operate in a saturated condition, thereby allowing emitter-base current to flow in transistor 46. This current is large enough to allow transistor 46 to operate in saturation. During this standby mode, the rest of the circuit is in the off state.

When the switch 24 is moved from an open to a closed position or momentarily closes, the timing circuit 10 is activated by a narrow positive trigger pulse applied to gate 35 as a result of charging of the capacitor 83 in the pulse forming RC network 84. In response to the application of a trigger pulse, thyristor 30 turns on so that current now flows in the emitter-collector circuit of transistor 46 and through the thyristor to the fuel pump solenoid valve 14, and also through resistor 76 to the relaxation oscillator 65. Thus, the load or solenoid valve 14 is energized and the timed cycle is started.

The time interval or duration of the timed cycle is controlled by the relaxation oscillator time constant, which is determined by the values of resistor 72 and capacitor 74. The timed cycle is ended a predetermined time after the start of the timed cycle, or after the thyristor is turned on, when the voltage across capacitor 74 reaches the peak-point voltage of the unijunction transistor 66, which then turns on. When unijunction transistor 66 turns on, the capacitor 74 discharges through the first-base emitter path and resistor 70, and also through the current limiting resistor 60 and the base 51 of transistor 52. This discharge of capacitor 74, which is referred to as a stop pulse, momentarily turns on transistor 52 which shunts or grounds the base of transistor 48, thereby momentarily turning transistor 48 off. Turning transistor 48 off, in turn, momentarily cuts off the base current supply to the base of transistor 46 so that transistor 46 momentarily turns off.

Thus, when the relaxation oscillator 65 generates a stop pulse and the transistor 46 turns off, the energizing current flow through thyristor 30 is interrupted and drops below the required holding current level of the thyristor 30, so that thyristor 30 turns off, thereby deenergizing the load or solenoid valve 14 and ending the timed cycle. At this point in operation, when the timed cycle is completed, the timing circuit 10 again returns to a standby mode of operation waiting for the next closure of switch 24. Switch 24 can be mechanically or manually closed and could comprise any suitable mechanical or electronic switch arrangement.

Once the timed cycle is started, the timing circuit 10 ignores all commands or signals until after the timed cycle is completed. Additional closures of the switch 24, after an initial closure and application of a trigger pulse to the thyristor gate 35, do not alter the duration of the timed cycle. As noted above, the duration of the timed cycle can be varied by changing the value of resistor 72 or capacitor 74 of the relaxation oscillator 65.

It is to be understood that the invention is not confined to the particular construction and arrangement of parts as herein illustrated and described but embraces all such modified forms thereof as come within the scope of the following claims.

What is claimed is:

1. An electronic timing circuit adapted to be connected to the first and second power terminals of a DC supply and for energizing a load during a predetermined timed cycle, said circuit comprising first semiconductor switching means having first, second, and third terminals, and a first-second terminal path adapted to be connected to the load to be energized, said first switching means being rendered conductive between said first and second terminals upon application of a trigger pulse to said third terminal so that current flows from the DC supply through said first switching means to energize the load and start the timed cycle, control circuit means for controlling the energizing current flow through said first-second terminal path, said control circuit means including a first transistor having an emitter-collector path connected in series relation with said first-second terminal path of said first switching means, a second transistor having a collector-emitter path connected to the base of said first transistor, and a third transistor having a collector-emitter path connected to the base of said second transistor, and timing circuit means connected in circuit with said first switching means and said control circuit means and operable a predetermined time after the start of the timed cycle for rendering said third transistor conductive to thereby render said second and first transistors nonconductive so that said first transistor interrupts the energizing current flow through said first switching means to thereby deenergize said load and end the timed cycle.

2. A circuit in accordance with claim 1 wherein said timing circuit means comprises relaxation oscillator means operable said predetermined time after the start of the timed cycle for generating a stop pulse which is coupled so said third transistor for rendering said circuit control means operative to deenergize the load and end the timed cycle.

3. A circuit in accordance with claim 2 wherein said relaxation oscillator means comprises a unijunction transistor having a first-base emitter path connected to said third transistor and through which said stop pulse flows said predetermined time after the start of the timed cycle.

4. A circuit in accordance with claim 3 wherein said relaxation oscillator means further comprises a resistor and capacitor connected in series relation and having a junction point therebetween connected to the emitter of said unijunction transistor, and voltage regulator means connected in parallel with said series connected resistor and capacitor.

5. A circuit in accordance with claim 1 and further comprising a switch connected to one of the power terminals and moveable from a first to a second position to initiate the timed cycle, and trigger pulse forming means connected to said switch for applying a trigger pulse to said third terminal when said switch is moved to said second position.

6. A circuit in accordance with claim 5 wherein said trigger pulse forming means comprising a first parallel RC network having one end connected to said third terminal of said first switching means and having an opposite end which is connected to said one of the power terminals when said switch moves to said second position.

7. A circuit in accordance with claim 6 and further comprising a parallel RC network connected between said second and third terminals of said first switching means for preventing false turn-off or triggering of said first switching means.

8. An electronic timing circuit adapted to be connected to the first and second power terminals of a DC supply and for energizing a load during a predetermined timed cycle, said circuit comprising a thyristor having an anode, a cathode, and a gate, and an anode-cathode path adapted to be connected to the load to be energized so that when said thyristor is rendered conductive upon application of a trigger pulse to said gate, current flows from the DC supply through said thyristor to energize the load and start the timed cycle, control circuit means including a first transistor having an emitter-collector path connected in series relation with said anode-cathode path of said thyristor; a second transistor having a collector-emitter path connected to the base of said first transistor, and a third transistor having a base, and collector-emitter path connected to the base of said second transistor, and timing circuit means connected in circuit with said thyristor and said control circuit means and operable a predetermined time after the start of the timed cycle for rendering said third transistor conductive to thereby render said second and first transistors nonconductive so that said first transistor interrupts the energizing current flow through said thyristor to thereby deenergize said load and end the timed cycle.

9. A circuit in accordance with claim 8 wherein said timing circuit means comprises relaxation oscillator means including a unijunction transistor having an emitter and a first base and having a first-base emitter path connected to said base of said third transistor, and also including a series connected resistor and capacitor connected to said thyristor cathode, and having a junction point therebetween connected to said emitter, and voltage regulation means connected in parallel across said series connected resistor and capacitor, said oscillator means being operable said predetermined time after the start of the timed cycle so that said unijunction transistor is rendered conductive and said capacitor discharges through said first-base emitter path for generating a stop pulse which is coupled to said base of said third transistor for rendering said circuit control means operative to deenergize the load and end the timed cycle.

10. A circuit in accordance with claim 8 and further comprising a switch connected to one of the power terminals and movable from a first to a second position to initiate the timed cycle, and trigger pulse forming means comprising a parallel RC network having one end connected to said switch and an opposite end connected to said gate for applying a trigger pulse to said gate when said switch is moved to said second position.

11. An electronic timing circuit adapted to be connected to the first and second power terminals of a DC supply and for energizing a load during a predetermined timed cycle, said circuit comprising a thyristor having an anode, a cathode, and a gate, and an anode-cathode path adapted to be connected to the load to be energized so that when said thyristor is rendered conductive upon application of a trigger pulse to said gate, current flows from the DC supply through said thyristor to energize the load and start the timed cycle, control circuit means for controlling the energizing current flow through said thyristor, said control circuit means including a first transistor having an emitter-collector path connected in series relation with said anode-cathode path of said thyristor, a second transistor having a collector-emitter path connected to the base of said first transistor, and a third transistor having a collector-emitter path connected to the base of said second transistor, and timing circuit means comprising a relaxation oscillator including a unijunction transistor having an emitter and a first base, and a first-base emitter path connected to the base of said third transistor, said oscillator also including a series connected resistor and capacitor connected to said thyristor cathode and having a junction point therebetween connected to said emitter of said unijunction transistor and voltage regulator means connected in parallel across said series connected resistor and capacitor, said oscillator being operable a predetermined time after the start of the timed cycle so that said unijunction transistor is rendered conductive and said capacitor discharges through said first-base emitter path for generating a stop pulse which is coupled to the base of said third transistor which is rendered conductive to thereby render said second and first transistors nonconductive so that said first transistor interrupts the energizing current flow through said thyristor to thereby deenergize the load and end the timed cycle.

12. A circuit in accordance with claim 11 and further comprising a switch connected to one of the power terminals and movable from a first to a second position to initiate the timed cycle, and trigger pulse forming means comprising a parallel RC network having one end connected to said switch and an opposite end connected to said gate for applying a trigger pulse to said gate when said switch is moved to said second position.

13. An accelerator pump timing control comprising a DC supply having first and second power terminals, a fuel pump solenoid valve, electronic timing circuit means for energizing said fuel pump solenoid valve during a predetermined timed cycle, timing circuit means comprising a thyristor having an anode, a cathode, and a gate, and an anode-cathode path connected to said solenoid valve, pulse forming means connected to said thyristor gate, switch means connected between one of said power terminals and said pulse forming means and movable from a first to a second position to render said pulse forming means operable for applying a trigger pulse to said thyristor gate, whereby said thyristor is rendered conductive and current flows from said DC supply through said thyristor to energize said solenoid valve and start the timed cycle, said timing circuit means also comprising control circuit means including a first transistor having an emitter-collector path connected in series relation with said anode-cathode path of said thyristor, a second transistor having a collector-emitter path connected to the base of said first transistor, and a third transistor having a collector-emitter path connected to the base of said second transistor, and timing circuit means connected in circuit with said thyristor and said control circuit means and operable a predetermined time after the start of the timed cycle for rendering said third transistor conductive to thereby render said second and first transistors nonconductive so that said first transistor interrupts the energizing current flow through said thyristor to thereby deenergize said solenoid valve and end the timed cycle.

14. A control in accordance with claim 13 and further comprising a current limiting resistor connected between said one of said power terminals and said switch, and a blocking diode connected between said thyristor-cathode and said solenoid valve for allowing said solenoid valve to be externally energized by an override signal without damaging said timing circuit means.

* * * * *